(12) United States Patent
Lu

(10) Patent No.: US 12,198,972 B1
(45) Date of Patent: Jan. 14, 2025

(54) PROCESS CHAMBER

(71) Applicant: BEIJING NAURA MICROELECTRONICS EQUIPMENT CO., LTD., Beijing (CN)

(72) Inventor: Yancheng Lu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/705,364

(22) PCT Filed: Oct. 21, 2022

(86) PCT No.: PCT/CN2022/126636
§ 371 (c)(1),
(2) Date: Apr. 26, 2024

(87) PCT Pub. No.: WO2023/078100
PCT Pub. Date: May 11, 2023

(30) Foreign Application Priority Data

Nov. 4, 2021 (CN) .......................... 202111298473.0

(51) Int. Cl.
*H01L 21/68* (2006.01)
*H01L 21/687* (2006.01)

(52) U.S. Cl.
CPC .. *H01L 21/68757* (2013.01); *H01L 21/68785* (2013.01)

(58) Field of Classification Search
CPC ......... H01L 21/68757; H01L 21/68785; H01L 21/67; H01L 21/67069; H01L 21/67103;
(Continued)

(56) References Cited

U.S. PATENT DOCUMENTS 10,763,153 B2 * 9/2020 Tashiro ............. H01J 37/32715
2019/0103301 A1 * 4/2019 Tashiro ............. H01L 21/68792

FOREIGN PATENT DOCUMENTS

CN 105448768 A * 3/2016
CN 103403857 B * 4/2016 ............. C23C 14/50
(Continued)

OTHER PUBLICATIONS

The World Intellectual Property Organization (WIPO) International Search Report for PCT/CN2022/126636 Dec. 23, 2022 5 Pages (including translation).

*Primary Examiner* — Bayan Salone
(74) *Attorney, Agent, or Firm* — ANOVA LAW GROUP, PLLC

(57) ABSTRACT

A process chamber in a semiconductor process device includes a cavity and a base disposed in the cavity. The base includes a base body and a support column fixedly disposed at the bottom of the base body. An interior of the support column includes a receiving hole that penetrates the support column in an axial direction of the support column. A fixed through-hole is formed at the bottom of the cavity. A bottom end of the support column is fixedly arranged in the fixed through-hole. The receiving hole is connected to the outside of the process chamber through the fixed through-hole. The fixed through-hole includes a positioning groove formed on the bottom wall of the cavity and a connection hole penetrating from the bottom of the positioning groove to an outer surface of the cavity.

12 Claims, 5 Drawing Sheets

(58) Field of Classification Search
CPC ................. H01L 21/6719; H01L 21/68; H01L 21/68792
See application file for complete search history.

(56) References Cited

FOREIGN PATENT DOCUMENTS

| | | | | |
|---|---|---|---|---|
| CN | 107546147 A | * | 1/2018 | |
| CN | 210805705 U | * | 6/2020 | |
| CN | 113745135 A | * | 12/2021 | ............. H01L 21/67 |
| TW | 202107522 A | | 2/2021 | |

* cited by examiner

_PROCESS CHAMBER_

CROSS-REFERENCE TO RELATED APPLICATIONS

This application is a national phase entry of PCT Patent Application No. PCT/CN2022/126636, filed on Oct. 21, 2022, which claims the priority of Chinese Patent Application No. 202111298473.0, filed on Nov. 4, 2021, the entire contents of all of which are incorporated herein by reference.

TECHNICAL FIELD

The present disclosure relates to the technical field of semiconductor processing device technology and, more particularly, to a device chamber.

BACKGROUND

A high-temperature chuck, also known as a heating chuck, a high-temperature base, etc., is a device used to carry and heat a wafer in a semiconductor device such as a stripper. When performing a process such as removing photoresist, a temperature of a process chamber is generally controlled uniformly at 60° C. To quickly oxidize the photoresist on the wafer at a high temperature and increase a removal rate, the high-temperature chuck heats the wafer. The high temperature is often maintained at 300° C. Due to a large temperature difference between the high-temperature chuck and the process chamber, a thermal insulation design between the high-temperature chuck and a cavity of the process chamber becomes particularly important.

SUMMARY

The present disclosure provides a process chamber in a semiconductor process device. The structure of the process chamber reduces the thermal load of the base, and improves the stability of the temperature field inside the process chamber.

One aspect of the present disclosure provides a process chamber in a semiconductor process device. The process chamber includes a cavity and a base disposed in the cavity. The base includes a base body and a support column fixedly disposed at the bottom of the base body. An interior of the support column includes a receiving hole that penetrates the support column in an axial direction of the support column. A fixed through-hole is formed at the bottom of the cavity. A bottom end of the support column is fixedly arranged in the fixed through-hole. The receiving hole is connected to the outside of the process chamber through the fixed through-hole. The fixed through-hole includes a positioning groove formed on the bottom wall of the cavity and a connection hole penetrating from the bottom of the positioning groove to an outer surface of the cavity. A positioning plate is formed on an outer wall of the support column around an axis of the support column. The positioning plate is disposed in the positioning groove. An annular thermal insulator is sleeved on the support column. The annular thermal insulator is disposed between a bottom surface of the positioning plate and the bottom of the positioning groove. The bottom end of the support column is fixedly connected to the outer wall of the cavity through a fixing member. The support column is subject to a downward pre-tightening force of the fixing member.

In some embodiments, a first connection plate is arranged on the outer wall of the support column around the axis of the support column. The first connection plate and the positioning plate are spaced apart along the axial direction of the support column and located at the bottom end of the support column. The first connection plate is fixedly connected to the outer wall of the cavity through the fixing member. The first connection plate is subject to the downward pre-tightening force of the fixing member.

In some embodiments, the fixing member includes a second connection plate and a plurality of fasteners. The second connection plate is arranged opposite to the first connection plate and is in contact with the bottom surface of the cavity. A plurality of first connection holes are formed in the second connection plate penetrating the second connection plate along a thickness direction. A plurality of second connection holes are formed in the first connection plate. The plurality of first connection holes are arranged to correspond in a one-to-one correspondence to positions of the plurality of second connection holes. The plurality of fasteners pass through the plurality of first connection holes and the corresponding plurality of second connection holes in sequence to fixedly connect the second connection plate to the first connection plate.

In some embodiments, a first thermal insulation gap is arranged between the side wall of the first connection plate and an inner wall of the connection hole, and a second thermal insulation gap is arranged between the first connection plate and the second connection plate.

In some embodiments, a positioning protrusion is formed on the side wall of the positioning plate, a positioning notch is formed on the side wall of the positioning groove, and the positioning protrusion with a corresponding shape is arranged in the positioning notch.

In some embodiments, an annular sealing ring groove surrounding an axis of the annular thermal insulator is formed respectively on the top and the bottom of the annular thermal insulator, and annular sealing rings are provided in both annular sealing ring grooves.

In some embodiments, the annular thermal insulator includes a first annular member, a second annular member, and a plurality of connecting members. The first annular member and the second annular member are spaced apart along a direction parallel to an axis of the annular heat insulator. The plurality of connecting members are distributed at intervals along a circumferential direction, and are connected between the first annular member and the second annular member.

In some embodiments, a plurality of linear air guide grooves evenly distributed along a circumferential direction of the base body are formed on a bearing surface of the base body, each linear air guide groove extending along a radial direction of the base body. A plurality of annular air guide grooves concentrically arranged and surrounding along an axis of the base body are formed on the bearing surface of the base body, each annular air guide groove intersects with the plurality of linear air guide grooves.

In some embodiments, the base body includes a plurality of pinholes distributed around the axis of the base body. The plurality of pinholes penetrate the base body along an axial direction of the base body. Each pinhole corresponds to a linear air guide groove passing through the pinhole.

In some embodiments, an annular limiting protrusion is formed on the bearing surface of the base body. The annular limiting protrusion surrounds along an axial direction of the base body. An outer surface of the annular limiting protrusion is flush with a side wall of the base body.

In some embodiments, the base body is made of an aluminum alloy. A corrosion resistance layer is formed on the bearing surface of the base body and an inner surface of the annular limiting protrusion through an anodizing treatment.

In some embodiments, a plurality of concentrically arranged annular air guide grooves are formed on the bearing surface of the base body, each annular air guide groove surrounding along the axis of the base body. One of the plurality of annular air guide grooves is located at a peripheral edge of the bearing surface and is in contact with the annular limiting protrusion.

In the process chamber provided by the present disclosure, the fixed through-hole at the bottom of the cavity includes the positioning groove and the connection hole penetrating from the bottom of the positioning groove to the outer surface of the cavity. The positioning plate on the outer wall of the support column is disposed in the positioning groove. The bottom end of the support column is fixedly connected to the outer wall of the cavity through the fixing member, and is subject to the downward pre-tightening force from the fixing member. As such, the support column of the base is locked downward by the pre-tightening force, and the positioning plate is pressed against the bottom of the positioning groove through the annular thermal insulator sleeved on the support column. While stably fixing the base, the annular thermal insulator is used to separate the support column from the cavity, effectively reduce the efficiency of heat transfer from the base to the cavity through the support column, reduce the thermal load of the base, improve the reliability of the components in the base, and save energy. At the same time, the stability of the temperature field inside the process chamber is improved, the failure risk of components connected to the process chamber is reduced, and the stability of the semiconductor process is improved.

BRIEF DESCRIPTION OF THE DRAWINGS

The above and/or additional aspects and advantages of the present disclosure will become apparent and readily understood from the following description of the embodiments in conjunction with the accompanying drawings.

DETAILED DESCRIPTION OF THE EMBODIMENTS

Figure 1:
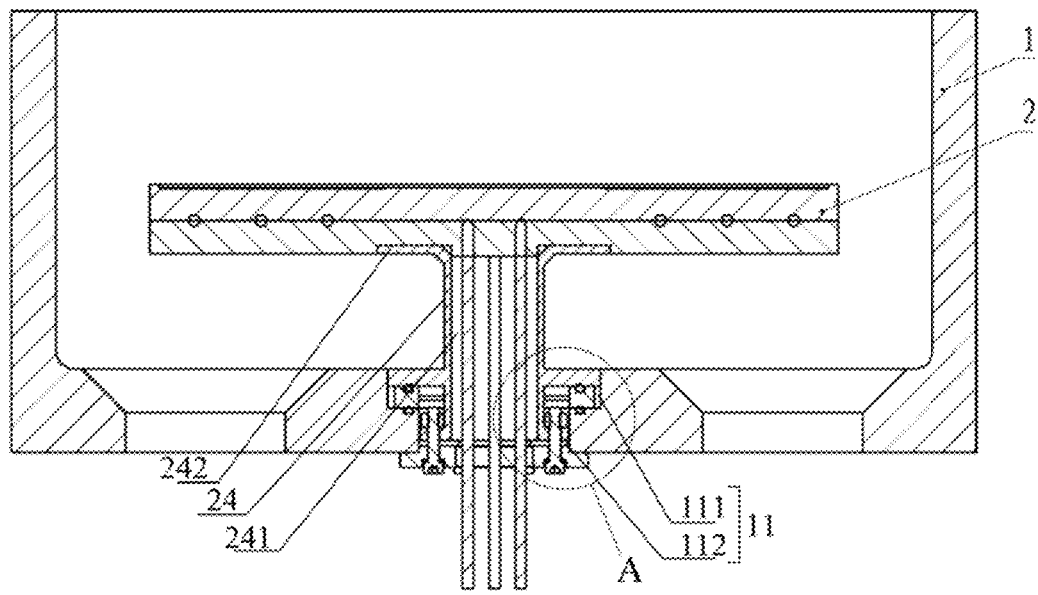
FIG. 1 is a structural diagram of a process chamber according to some embodiments of the present disclosure.

Various embodiments of the present disclosure will be described in detail below with reference to the accompanying drawings. It should be understood that the embodiments described here are merely used to illustrate and explain the present disclosure, and are not intended to limit the present disclosure.

In an existing process chamber including a high-temperature chuck, such as a device used in a stripping process, a bottom support column of the high-temperature chuck is often directly fixed on a bottom wall of the process chamber. The high-temperature chuck is connected to the process chamber. A large temperature difference between the high-temperature chuck and a cavity of the process chamber causes a large amount of heat transfer between the high-temperature chuck and the cavity of the process chamber. On one hand, it increases a thermal load of the high-temperature chuck (to maintain a high temperature of the high-temperature chuck, the high-temperature chuck itself and a part of the cavity need to be heated at the same time), causing unnecessary waste of energy. On the other hand, a temperature of the bottom of the cavity increases. It leads to an uneven temperature field inside the cavity, which not only affects stability of a semiconductor process, but also leads to a series of problems such as failures of components connected to the cavity. In addition, when the bottom support column of the high-temperature chuck and the process chamber cavity are sealed by an O-ring, a risk that the O-ring may fail at high temperature still exists. Replacing the O-ring with a sealing structure that can withstand extremely high temperatures will increase material cost of a process equipment.

To solve the above technical problems, the present disclosure provides a process chamber included in a semiconductor process device. As shown in FIGS. 1 to 4, the process chamber includes a cavity 1 and a base 2 disposed in the cavity 1. The base 2 includes a base body 21 and a support column 24 fixedly disposed at the bottom of the base body 21. An interior of the support column 24 includes a receiving hole 241 that penetrates the support column 24 in an axial direction of the support column 24. A fixed through-hole 11 is formed at the bottom of the cavity 1. A bottom end of the support column 24 is fixedly arranged in the fixed through-hole 11. The receiving hole 241 is connected to the outside of the process chamber through the fixed through-hole 11.

The fixed through-hole 11 includes a positioning groove 111 formed on the bottom wall of the cavity 1 and a connection hole 112 penetrating from the bottom of the positioning groove 111 to an outer surface of the cavity 1. A positioning plate 2 is formed on an outer wall of the support column 24 around an axis of the support column 24. The positioning plate 25 is disposed in the positioning groove 111. An annular thermal insulator 3 is sleeved on the support column 24. The annular thermal insulator 3 is disposed between a bottom surface of the positioning plate 25 and the bottom of the positioning groove 111 (i.e., the bottom surface of the positioning groove 111). The bottom end of the support column 24 is fixedly connected to the outer wall of the cavity 1 through a fixing member, and the support column 24 is subject to a downward pre-tightening force of the fixing member.

It should be noted that the receiving hole 241 of the support column 24 is used to receive cables, pipelines, and other structures between the base body 21 and other components outside the process chamber. For example, when the base 2 is used as the high-temperature chuck as shown in FIG. 1, the base body 21 may include an upper pad and a lower pad that are stacked along a height direction (i.e., an axial direction of the base body 21). Heating wire grooves with corresponding shapes are formed on opposite surfaces of the upper pad and the lower pad. The upper pad and the lower pad are connected through welding. The heating wire groove on the upper pad and the heating wire groove on the lower pad are coupled to form a heating wire hole in the base body 21 extending in a horizontal plane. A heating wire is disposed in the heating wire hole. The cable of the heating wire passes through the receiving hole 241 of the support column 24 and is connected to a power supply outside the process chamber. Driven by a current supplied the power supply, the heating wire heats the base body 21 and a wafer 100 carried thereon. In some embodiments, a cooling passage may be provided in the base body 21, and an inlet pipe and an outlet pipe of the cooling passage may pass through the receiving hole 241 of the support column 24 and may be connected with a cooling source outside the process chamber. A coolant provided by the cooling source may circulate through the cooling passage in the base body 21 to cool the base body 21, such that the base 2 can be quickly cooled, thereby facilitating maintenance and saving maintenance time.

In the embodiments of the present disclosure, the fixed through-hole 11 at the bottom of the cavity 1 includes the positioning groove 111 and the connection hole 112 penetrating from the bottom of the positioning groove 111 to the outer surface of the cavity 1. The positioning plate 25 on the outer wall of the support column 24 is disposed in the positioning groove 111. The bottom end of the support column 24 is fixedly connected to the outer wall of the cavity 1 through the fixing member, and is subject to the downward pre-tightening force of the fixing member. The support column 24 of the base 2 is locked downward by the pre-tightening force, such that the positioning plate 25 is pressed against the bottom of the positioning groove 111 through the annular thermal insulator 3 arranged around the support column 24. While stably fixing the base 2, the annular thermal insulator 3 is also used to separate the support column 24 from the cavity 1. Thus, efficiency of heat transfer from the base 2 to the cavity 1 through the support column 24 is effectively reduced, the thermal load of the base 2 is reduced, reliability of components (i.e., the heating wire) in the base 2 is improved, and energy is saved. At the same time, the stability of the temperature field inside the process chamber is improved, failure risk of components connected to the process chamber is reduced, and the stability of the semiconductor process is improved.

Figure 4:
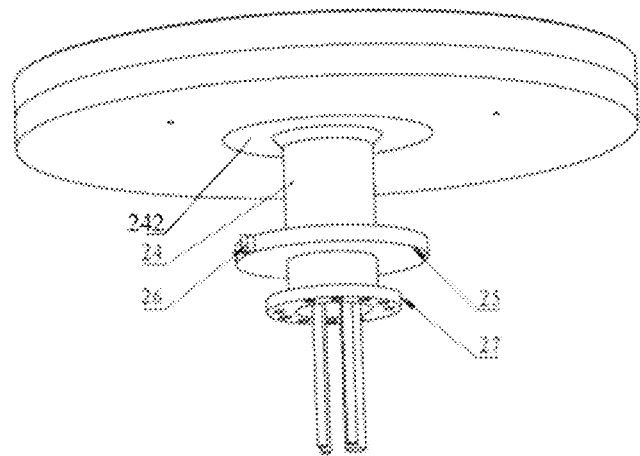
FIG. 4 is a structural diagram of a base in a process chamber from another perspective according to some embodiments of the present disclosure.

In some embodiments, as shown in FIGS. 1 and 4, a welding pad 242 is formed on the top of the support column 24, and a welding groove is formed on the bottom of the base body 21. The welding pad 242 is welded and fixed to the welding groove, thereby achieving a fixed connection between the base body 21 and the support column 24.

Figure 2:
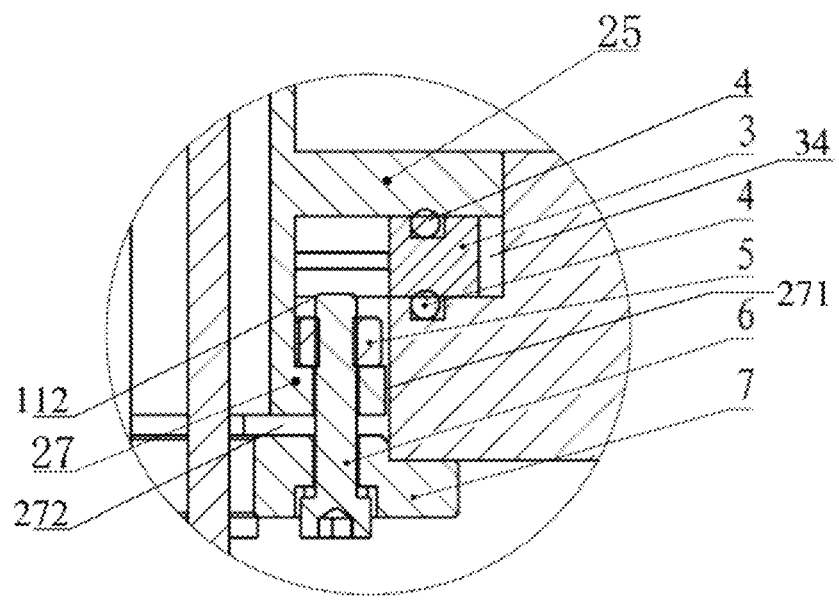
FIG. 2 is a partially enlarged schematic diagram of an area A in FIG. 1.

In some embodiments, as shown in FIG. 2, to improve a sealing effect of the process chamber, an annular sealing ring groove surrounding an axis of the annular thermal insulator 3 is formed respectively on the top and the bottom of the annular thermal insulator 3. Annular sealing rings 4 are provided in both annular sealing ring grooves.

In some embodiments, as shown in FIG. 2, to further reduce a heat transfer rate between the bottom end of the support column 24 and the cavity 1, a thermal insulation gap 34 is arranged between sidewalls of the annular thermal insulator 3 and sidewalls of the positioning groove 111. In some embodiments, the thermal insulation gap 34 has a size (i.e., a size in a radial direction of the annular thermal insulator 3) of 2-3 mm. The thermal insulation gap 34 is used to reduce a contact area between the annular thermal insulator 3 and the cavity 1, thereby further reducing the heat transfer rate between the bottom end of the support column 24 and the cavity 1.

In some embodiments, the annular thermal insulator 3 may be made of a metal with a small thermal conductivity (e.g., less than 20 W/m·K), for example, a titanium alloy (having a thermal conductivity about $\frac{1}{14}$ of aluminum).

Figure 5:
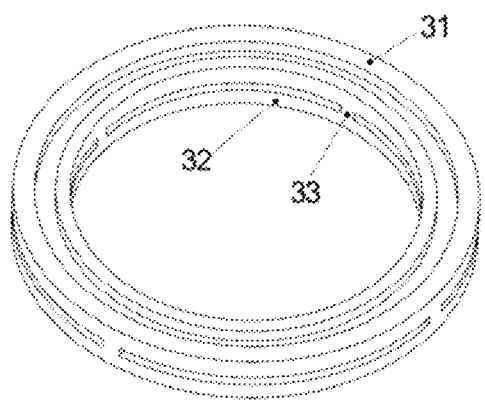
FIG. 5 is a structural diagram of an annular thermal insulator in a process chamber according to some embodiments of the present disclosure.
Figure 6:
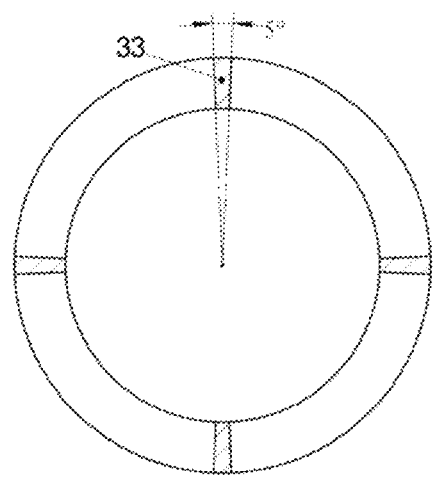
FIG. 6 is a cross-sectional view of an annular thermal insulator in a process chamber according to some embodiments of the present disclosure.

In some embodiments, as shown in FIGS. 5 and 6, to further reduce the heat transfer rate between the bottom end of the support column 24 and the cavity 1, the annular thermal insulator 3 includes a first annular member 31, a second annular member 32, and a plurality of connecting members 33. The first annular member 31 and the second annular member 32 are spaced apart along a height direction (i.e., a direction parallel to the axis of the annular heat insulator 3). The plurality of connecting members 33 are distributed at intervals along a circumferential direction, and are connected between the first annular member 31 and the second annular member 32. In some embodiments, to improve stability of the plurality of connecting members 33 between the first annular member 31 and the second annular member 32, the plurality of connecting member 33 are distributed at equal intervals along the circumferential direction. In some other embodiments, as shown in FIG. 6, four connecting members 33 are connected between the first annular member 31 and the second annular member 32. Each of the plurality of connecting members 33 includes two side surfaces whose planes pass through the axis of the annular thermal insulator 3, and an angle formed between the two side surfaces is about 5°.

In the embodiments of the present disclosure, each of the plurality of connecting member 33 connected between the first annular member 31 and the second annular member 32 has an extremely small horizontal cross-section, that is, being a thin-walled structure, which substantially reduces the heat transfer rate from top to bottom. For example, four connecting members 33 are connected between the first annular member 31 and the second annular member 32, and the angle formed between the two side surfaces of each connecting member 33 is about 5°. A heat transfer area of the annular thermal insulator 3 for heat transfer from top to bottom will be reduced to $\frac{1}{18}$ of an initial heat transfer area (i.e., 4*5°/360°), thereby substantially reducing the heat transfer rate between the bottom end of the support column 24 and the cavity 1.

In some embodiments, as shown in FIGS. 1 to 4, to improve uniformity of the downward pre-tightening force exerted by the fixing member on the support column 24 along the circumferential direction, a first connection plate 27 is arranged on the outer wall of the support column 24 around the axis of the support column 24. The first connection plate 27 and the positioning plate 25 are spaced apart along the axial direction of the support column 24 and located at the bottom end of the support column 24. The first connection plate 27 is fixedly connected to the outer wall of the cavity 1 through the fixing member. The first connection plate 27 is subject to the downward pre-tightening force of the fixing member.

It should be noted that the pre-tightening force exerted on the first connection plate 27 is evenly distributed along the circumferential direction. In the embodiments of the present disclosure, the fixing member exerts the downward pre-tightening force on the supporting column 24 through the first connection plate 27 surrounding the axis of the supporting column 24, thereby improving the uniformity of the pre-tightening force distributed in the circumferential direction and improving the stability of the position of the base 2 in the process chamber.

In some embodiments, the fixing member and the first connection plate 27 may be tightly connected through a flange butt connection. For example, as shown in FIGS. 1 to 4, the fixing member includes a second connection plate 7 and a plurality of fasteners 6. The second connection plate 7 is arranged opposite to the first connection plate 27 and is in contact with the bottom surface of the cavity 1. A plurality of first connection holes are formed in the second connection plate 7 penetrating the second connection plate 7 along a thickness direction (i.e., a direction parallel to the axis of the support column 24). A plurality of second connection holes are formed in the first connection plate 27. The plurality of first connection holes are arranged to correspond in a one-to-one correspondence to positions of the plurality of second connection holes. The plurality of fasteners 6 pass through the plurality of first connection holes and the corresponding plurality of second connection holes in sequence to fixedly connect the second connection plate 7 to the first connection plate 27.

In the embodiments of the present disclosure, the fixing member includes the second connection plate 7 and the plurality of fasteners 6. Both the first connection plate 27 and the second connection plate 7 include the flange structure. The second connection plate 7 has a diameter larger than a diameter of the connection hole 112, such that a top surface of the second connection plate 7 presses against the bottom of the process chamber. Through tightening action of multiple fixing members, the first connection plate 27 may be pushed down uniformly in the circumferential direction, such that the positioning plate 25 can stably press against the bottom surface of the positioning groove 111 through the annular thermal insulator 3 to stably fix the base 2 in the process chamber.

Structures of the plurality of fasteners are not limited by the embodiments of the present disclosure. For example, each of the plurality of fasteners 6 may be a rivet, a bolt, or other suitable parts. In some embodiments, as shown in FIG. 2, to conveniently assemble and disassemble the first connection plate 27 and the second connection plate 7 and to improve circumferential force uniformity of the first connection plate 27, a snap ring 5 is arranged on the support column 24. The snap ring 5 is located between the positioning plate 25 and the first connection plate 27. The snap ring 5 is formed with a plurality of threaded holes penetrating the snap ring 5 along the thickness direction (i.e., the direction parallel to the axis of the support column 24). Each of the plurality of fasteners 6 is a set screw. The first connection hole and the second connection hole are both smooth holes. The set screw passes through the second connection hole, the first connection hole, and the corresponding threaded hole in sequence from bottom to top, and is tightened in the threaded hole, such that the snap ring 5 is used to press down the first connection plate 27 to fixedly connect the first connection plate 27 to the second connection plate 7.

In some embodiments, as shown in FIG. 2, to further reduce the heat transfer rate between the bottom end of the support column 24 and the cavity 1, a first thermal insulation gap 271 is arranged between the side wall of the first connection plate 27 and an inner wall of the connection hole 112, and a second thermal insulation gap 272 is arranged between the first connection plate 27 and the second connection plate 7.

In the embodiments of the present disclosure, the thermal insulation gaps are arranged between the side wall of the first connection plate 27 and the inner wall of the connection hole 112 and between the first connection plate 27 and the second connection plate 7, thereby preventing direct or indirect (through the second connection plate 7) heat transfer between the first connection plate 27 and the cavity 1, and further reducing the thermal load of the base 2. In some embodiments, both the first thermal insulation gap 271 and the second thermal insulation gap 272 are larger than 2 mm.

Figure 7:
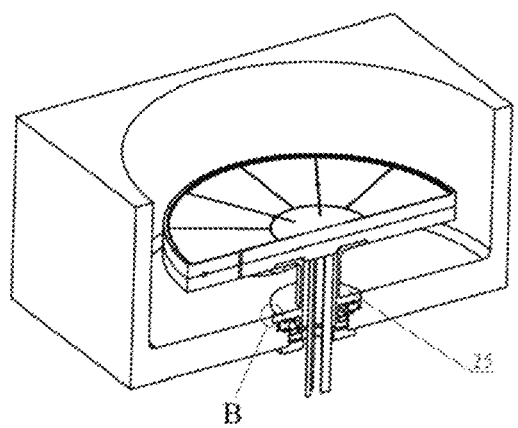
FIG. 7 is a cross-sectional view of a process chamber according to some embodiments of the present disclosure.
Figure 8:
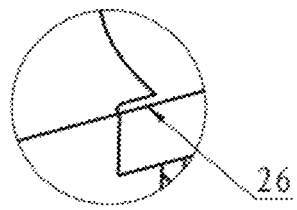
FIG. 8 is a partially enlarged schematic diagram of an area B in FIG. 7.

In some embodiments, as shown in FIGS. 4, 7, and 8, to further improve the stability of the position of the base 2, a positioning protrusion 26 is formed on the side wall of the positioning plate 25, and a positioning notch is formed on the side wall of the positioning groove 111. The positioning protrusion 26 with a corresponding shape is arranged in the positioning notch.

In the embodiments of the present disclosure, the positioning protrusion 26 is formed on the side wall of the positioning plate 25, and the positioning notch with the corresponding shape is formed on the side wall of the positioning groove 111, such that through a coupling relationship between the positioning protrusion 26 and the positioning notch, the base 2 is circumferentially positioned to limit a rotation angle of the base 2, thereby ensuring the correct position of the base 2 after each disassembly, assembly, and maintenance.

Figure 3:
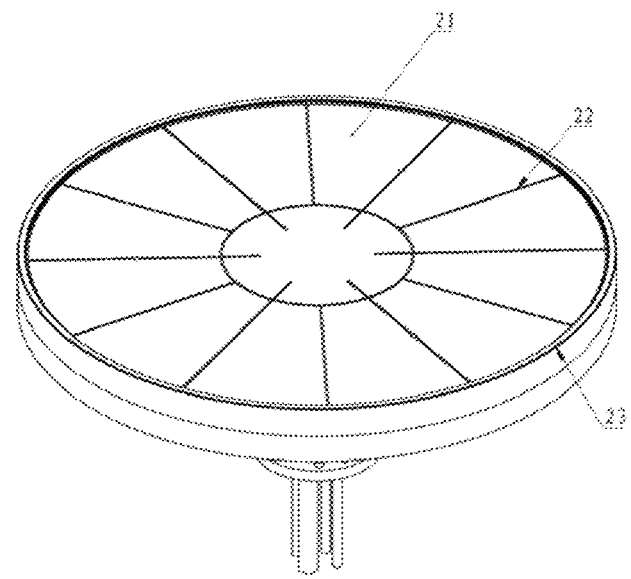
FIG. 3 is a structural diagram of a base in a process chamber according to some embodiments of the present disclosure.

In some embodiments, as shown in FIG. 3, to improve accuracy of wafer position, an annular limiting protrusion 23 is formed on a bearing surface of the base body 21. The annular limiting protrusion 23 surrounds along the axial direction of the base body 21, and an outer surface of the annular limiting protrusion 23 is flush with the side wall of the base body 21.

In the embodiments of the present disclosure, the annular limiting protrusion 23 is used to limit the wafer position. For example, when an outer diameter of the annular limiting protrusion 23 (i.e., a diameter of an outer contour) is approximately 310 mm, and an inner diameter (i.e., a diameter of an inner contour) is approximately 301 mm, a 12-inch wafer may be limited in the annular limiting protrusion 23 to prevent the wafer from horizontally shifting on the bearing surface of the base 2. That is, the function of the annular limiting protrusion 23 is equivalent to a focus ring. The difference is that the annular limiting protrusion 23 in the present disclosure is formed as a part of the base 2. For example, both the annular limiting protrusion 23 and the base 2 may integrally formed. Thus, the need for installing an independent focusing ring on the base 2 is eliminated. While the structure of the base 2 as well as installation and maintenance processes are simplified, the material cost of the semiconductor process device is also reduced.

In some embodiments, the height of the annular limiting protrusion 23 is approximately 1.5-2 mm. In some embodiments, the material of the base body 21 may be aluminum alloy, and a corrosion resistance layer is formed on the bearing surface of the base body 21 and the inner surface of the annular limiting protrusion 23 through a hard anodizing treatment or a natural anodizing treatment. The corrosion resistance layer prevents the base body 21 from being etched by plasma, extends the service life of the base body 21, and protects a chamber environment from being polluted.

In some embodiments, as shown in FIGS. 3, 7, 9, and 10, to further improve an accuracy of a position of landing a wafer 100 on the bearing surface of the base 2, an air guide groove 22 is formed on the bearing surface of the base body 21. The air guide groove 22 includes a plurality of linear air guide grooves 221 evenly distributed along the circumferential direction of the base body 21. Each linear air guide groove 221 extends along the radial direction of the base body 21. The air guide groove 22 also includes a plurality of concentrically arranged annular air guide grooves 222. Each annular air guide groove 222 surrounds along the axis of the base body 21, and each annular air guide groove 222 intersects with the plurality of linear air guide grooves 221.

In the embodiments of the present disclosure, the air guide groove 22 is formed on the bearing surface of the base body 21. The air guide groove 22 includes the plurality of linear air guide grooves 221 and the plurality of annular air guide grooves 222, such that during a process of landing the wafer 100 on the bearing surface, the gas between the wafer 100 and the bearing surface can be uniformly discharged to the surroundings under the guidance of the plurality of linear air guide grooves 221 that are evenly distributed in the radial direction. Even if air pressures and gas flow rates are different at different linear air guide grooves 221, the gas at a higher pressure may flow appropriately to a position having a lower pressure under the circumferential guidance of the plurality of annular air guide grooves 222. Thus, the gas between the wafer 100 and the bearing surface is ensured to discharge uniformly in the circumferential direction. When descending to the bearing surface, the horizontal position deviation of the wafer 100 is prevented, thereby improving the accuracy of the wafer 100 position.

Figure 9:
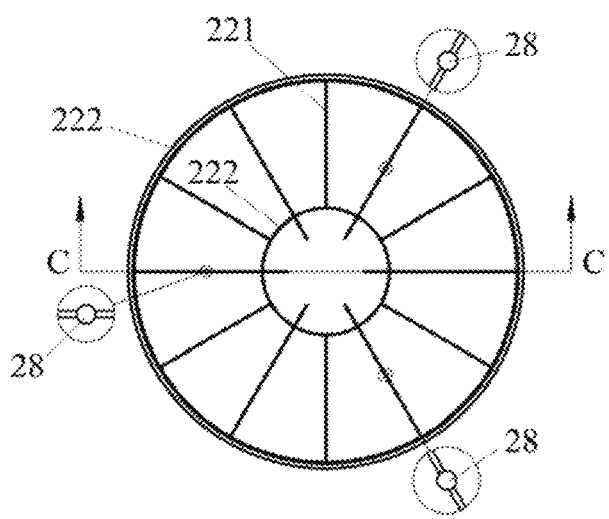
FIG. 9 is a top view of a base in a process chamber according to some embodiments of the present disclosure.
Figure 10:
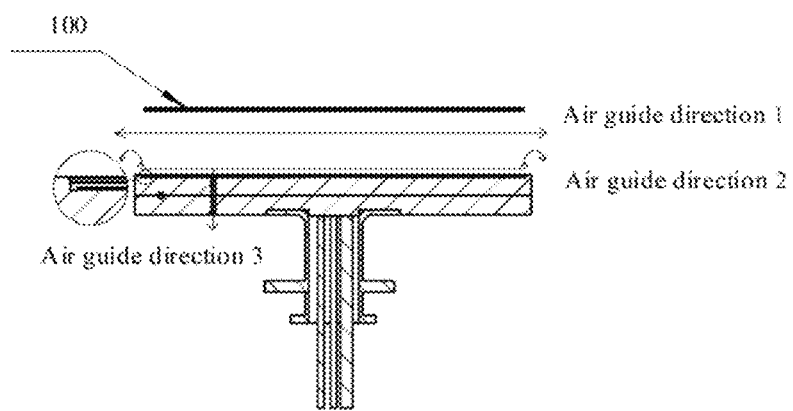
FIG. 10 is a cross-sectional view of a base in a C-C direction in FIG. 9.

In some embodiments, as shown in FIGS. 7, 9, and 10, one of the plurality of annular air guide grooves 222 is located at a peripheral edge of the bearing surface and is in contact with the annular limiting protrusion 23 (the inner side). As such, an annular air guide groove 222 located at the peripheral edge plays a buffering effect on the gas flowing above the annular limiting protrusion 23, further improving the circumferential uniformity of the flow field of the discharged gas. In some embodiments, as shown in FIGS. 7, 9, and 10, the air guide groove 22 includes eight linear air guide grooves 221 and two annular air guide grooves 222. One of the two annular air guide grooves 222 is arranged close to the center of the bearing surface, and another annular air guide groove 222 is located at the peripheral edge of the bearing surface and is in contact with the annular limiting protrusion 23.

In some embodiments, the base body 21 includes a plurality of pinholes 28 distributed around the axis of the base body 21. The plurality of pinholes 28 penetrate the base body 21 along the axial direction of the base body 21 to allow wafer ejection pins to pass through the base body 21 from the bottom of the base body 21 to the top of the bearing surface of the base body 21 and to support the wafer 100. Each pinhole 28 corresponds to a linear air guide groove 221 passing through the pinhole 28.

In some embodiments, each pinhole 28 corresponds to a linear air guide groove 221 passing through the pinhole 28. As shown in FIG. 10, when the wafer 100 gradually descends as the wafer ejection pins descends, the gas between the wafer 100 and the bearing surface is discharged along three paths shown in FIG. 10. That is, a first portion of the gas is discharged horizontally in the circumferential direction (air guide direction 1), a second portion of the gas is discharged circumferentially (air guide direction 2) under the guidance of the air guide groove 22, and a third portion of the gas is discharged downward through the pinholes 28 under the guidance of the plurality of air guide grooves 221 of the air guide groove. As such, a guide function of the air guide groove 22 is combined with the pinhole 28 structure of the base to further improve the uniform discharge of the gas between the wafer 100 and the bearing surface along the circumferential direction, thereby improving the accuracy of the wafer 100 position.

In the process chamber provided by the present disclosure, the fixed through-hole 11 at the bottom of the cavity 1 includes the positioning groove 111 and the connection hole 112 penetrating from the bottom of the positioning groove 111 to the outer surface of the cavity 1. The positioning plate 25 on the outer wall of the support column 24 is disposed in the positioning groove 111. The bottom end of the support column 24 is fixedly connected to the outer wall of the cavity 1 through the fixing member, and is subject to the downward pre-tightening force from the fixing member. As such, the support column 24 of the base 2 is locked downward by the pre-tightening force, and the positioning plate 25 is pressed against the bottom of the positioning groove 111 through the annular thermal insulator 3 sleeved on the support column 24. While stably fixing the base 2, the annular thermal insulator 3 is used to separate the support column 24 from the cavity 1, effectively reduce the efficiency of heat transfer from the base 2 to the cavity 1 through the support column 24, reduce the thermal load of the base 2, improve the reliability of the components in the base 2, and save energy. At the same time, the stability of the temperature field inside the process chamber is improved, the failure risk of components connected to the process chamber is reduced, and the stability of the semiconductor process is improved.

It can be understood that the above embodiments are merely exemplary embodiments adopted to illustrate the principles of the present disclosure, but the present disclosure is not limited thereto. For those of ordinary skill in the art, various modifications and improvements can be made without departing from the spirit and essence of the present disclosure, and these modifications and improvements are also regarded as within the scope of the present disclosure.

What is claimed is:
1. A process chamber in a semiconductor process device, comprising a cavity and a base disposed in the cavity, wherein:
   the base includes a base body and a support column fixedly disposed at the bottom of the base body;
   an interior of the support column includes a receiving hole that penetrates the support column in an axial direction of the support column;
   a fixed through-hole is formed at the bottom of the cavity;
   a bottom end of the support column is fixedly arranged in the fixed through-hole;
   the receiving hole is connected to the outside of the process chamber through the fixed through-hole;
   the fixed through-hole includes a positioning groove formed on the bottom wall of the cavity and a connection hole penetrating from the bottom of the positioning groove to an outer surface of the cavity;
   a positioning plate is formed on an outer wall of the support column around an axis of the support column;
   the positioning plate is disposed in the positioning groove;
   an annular thermal insulator is sleeved on the support column;
   the annular thermal insulator is disposed between a bottom surface of the positioning plate and the bottom of the positioning groove;
   the bottom end of the support column is fixedly connected to the outer wall of the cavity through a fixing member; and
   the support column is subject to a downward pre-tightening force of the fixing member.

2. The process chamber according to claim 1, wherein:
a first connection plate is arranged on the outer wall of the support column around the axis of the support column;
the first connection plate and the positioning plate are spaced apart along the axial direction of the support column and located at the bottom end of the support column;
the first connection plate is fixedly connected to the outer wall of the cavity through the fixing member; and
the first connection plate is subject to the downward pre-tightening force of the fixing member.

3. The process chamber according to claim 2, wherein:
the fixing member includes a second connection plate and a plurality of fasteners;
the second connection plate is arranged opposite to the first connection plate and is in contact with the bottom surface of the cavity;
a plurality of first connection holes are formed in the second connection plate penetrating the second connection plate along a thickness direction;
a plurality of second connection holes are formed in the first connection plate;
the plurality of first connection holes are arranged to correspond in a one-to-one correspondence to positions of the plurality of second connection holes; and
the plurality of fasteners pass through the plurality of first connection holes and the corresponding plurality of second connection holes in sequence to fixedly connect the second connection plate to the first connection plate.

4. The process chamber according to claim 3, wherein:
a first thermal insulation gap is arranged between the side wall of the first connection plate and an inner wall of the connection hole, and a second thermal insulation gap is arranged between the first connection plate and the second connection plate.

5. The process chamber according to claim 1, wherein:
a positioning protrusion is formed on the side wall of the positioning plate, a positioning notch is formed on the side wall of the positioning groove, and the positioning protrusion with a corresponding shape is arranged in the positioning notch.

6. The process chamber according to claim 1, wherein:
an annular sealing ring groove surrounding an axis of the annular thermal insulator is formed respectively on the top and the bottom of the annular thermal insulator, and annular sealing rings are provided in both annular sealing ring grooves.

7. The process chamber according to claim 1, wherein:
the annular thermal insulator includes a first annular member, a second annular member, and a plurality of connecting members;
the first annular member and the second annular member are spaced apart along a direction parallel to an axis of the annular heat insulator; and
the plurality of connecting members are distributed at intervals along a circumferential direction, and are connected between the first annular member and the second annular member.

8. The process chamber according to claim 1, wherein:
a plurality of linear air guide grooves evenly distributed along a circumferential direction of the base body are formed on a bearing surface of the base body, each linear air guide groove extending along a radial direction of the base body; and
a plurality of annular air guide grooves concentrically arranged and surrounding along an axis of the base body are formed on the bearing surface of the base body, each annular air guide groove intersects with the plurality of linear air guide grooves.

9. The process chamber according to claim 8, wherein:
the base body includes a plurality of pinholes distributed around the axis of the base body;
the plurality of pinholes penetrate the base body along an axial direction of the base body; and
each pinhole corresponds to a linear air guide groove passing through the pinhole.

10. The process chamber according to claim 1, wherein:
an annular limiting protrusion is formed on the bearing surface of the base body;
the annular limiting protrusion surrounds along an axial direction of the base body; and
an outer surface of the annular limiting protrusion is flush with a side wall of the base body.

11. The process chamber according to claim 10, wherein:
the base body is made of an aluminum alloy; and
a corrosion resistance layer is formed on the bearing surface of the base body and an inner surface of the annular limiting protrusion through an anodizing treatment.

12. The process chamber according to claim 10, wherein:
a plurality of concentrically arranged annular air guide grooves are formed on the bearing surface of the base body, each annular air guide groove surrounding along the axis of the base body; and
one of the plurality of annular air guide grooves is located at a peripheral edge of the bearing surface and is in contact with the annular limiting protrusion.

* * * * *